US006624087B2

United States Patent
Roh et al.

(10) Patent No.: US 6,624,087 B2
(45) Date of Patent: Sep. 23, 2003

(54) ETCHANT FOR PATTERNING INDIUM TIN OXIDE AND METHOD OF FABRICATING LIQUID CRYSTAL DISPLAY DEVICE USING THE SAME

(75) Inventors: Byung Tae Roh, Seoul (KR); You Shin Ahn, Kyongsangbuk-do (KR)

(73) Assignee: LG. Philips Co., Ltd., Seoul (KR)

( * ) Notice: Subject to any disclaimer, the term of this patent is extended or adjusted under 35 U.S.C. 154(b) by 0 days.

(21) Appl. No.: 10/138,639

(22) Filed: May 6, 2002

(65) Prior Publication Data

US 2002/0164888 A1 Nov. 7, 2002

(30) Foreign Application Priority Data

May 7, 2001 (KR) .................................... P2001-24664

(51) Int. Cl.$^7$ .............................................. H01L 2/302
(52) U.S. Cl. .................. 438/754; 438/748; 438/747; 438/29; 216/5; 216/23; 216/25; 216/90; 216/101
(58) Field of Search ................... 252/79.1, 79.2, 252/79.3, 79.4; 216/5, 23, 25, 90, 91, 92, 101; 438/747, 748, 754, 29

(56) References Cited

U.S. PATENT DOCUMENTS 5,366,588 A * 11/1994 Scholten et al. ............ 156/656

FOREIGN PATENT DOCUMENTS

JP 2000-309888 * 11/2000

* cited by examiner

Primary Examiner—George Goudreau
(74) Attorney, Agent, or Firm—Morgan, Lewis & Bockius LLP

(57) ABSTRACT

An etchant for patterning indium tin oxide, wherein the etchant is a mixed solution of HCl, $CH_3COOH$, and water, and a method of fabricating a liquid crystal display device are disclosed in the present invention. The method includes forming a gate electrode on a substrate, forming a gate insulating layer and an amorphous silicon layer on the gate electrode including the substrate, forming an active area by patterning the amorphous silicon layer, forming a source electrode and a drain electrode on the active area, forming a passivation layer on the source electrode and the drain electrode and the gate insulating layer, forming a contact hole exposing a part of the drain electrode, forming an indium tin oxide layer on the passivation layer, and forming an indium tin oxide electrode by selectively etching the indium tin oxide layer using a mixed solution of HCl, $CH_3COOH$, and water as an etchant.

8 Claims, 5 Drawing Sheets

ETCHANT FOR PATTERNING INDIUM TIN OXIDE AND METHOD OF FABRICATING LIQUID CRYSTAL DISPLAY DEVICE USING THE SAME

This application claims the benefit of the Korean Patent Application No. P2001-024664 filed on May 7, 2001, which is hereby incorporated by reference.

BACKGROUND OF THE INVENTION

1. Field of the Invention

The present invention relates to an etchant, and particularly, to an etchant for patterning indium tin oxide. Although the present invention is suitable for a wide scope of applications, it is particularly suitable for preventing damage on the underlying layers and precipitation during an etching process.

2. Discussion of the Related Art

Generally, indium tin oxide (ITO) used as a transparent electrode in a display device is etched to form a pattern using a mixed solution of HCl and $HNO_3$ or oxalic acid ($C_2H_2O_4$). In addition, an etching process of amorphous ITO (a-ITO) to fabricate a thin film transistor display device will be described with reference to the drawings as follows.

FIG. 1 is a plane view for a unit pixel showing a thin film transistor display device. As shown therein, a gate line 2 and a data line 4 are arranged to cross each other. A pixel electrode 8 formed of a transparent metal such as ITO is disposed at the pixel area defined by the gate line 2 and the data line 4. On the other hand, a gate insulating film (not shown) is disposed between the gate line 2 and the data line 4 for an electrical insulation. A thin film transistor (TFT) is formed at the crossed point of the gate line 2 and the data line 4 in order to drive each pixel.

More specifically, the TFT includes a gate electrode 2a connected to the gate line 2, a gate insulating film (not shown) covering the gate electrode 2a, an active area 5 formed on the gate insulating film as a pattern form, and a source electrode 4a and a drain electrode 4b formed at the active area 5 to be apart from each other. In addition, the drain electrode 4b is connected to the pixel electrode 8 through a contact hole 9.

FIGS. 2A to 2D are sequential cross-sectional views illustrating fabrication processes along line II—II of FIG. 1.

As shown therein, a fabrication method includes forming a gate electrode 2a on a glass substrate 1, and depositing a gate insulating layer 3, an amorphous silicon 5a, and an $n^+$ amorphous silicon 5b having a high concentration n-type ions injected therein are sequentially formed over the gate electrode 2a and the glass substrate 1 (shown in FIG. 2A). An active area 5 is formed by patterning the amorphous silicon 5a and an $n^+$ amorphous silicon 5b, and a source electrode 4a and a drain electrode 4b are formed by depositing Mo on the active area 5, and then patterned to form the respective portions separated by a certain distance from the center portion of the $n^+$ amorphous silicon 5b.

In FIG. 2B, the source and drain electrodes 4a and 4b are formed to extend over the end portions of the amorphous silicon 5a and the $n^+$ amorphous silicon 5b, and onto a portion of the gate insulating layer 3. Here, portions of the $n^+$ amorphous silicon 5b are exposed between the source electrode 4a and drain electrode 4b.

Thereafter, in FIG. 2C, a passivation film 7 is deposited over the above structure FIG. 2B. An ITO electrode 8 is formed over the drain electrode 4b after exposing the upper part of the drain electrode 4b by forming a contact hole 9 on the passivation film 7 through a photolithography process.

As shown in FIG. 2D, the ITO electrode 8 pattern, which is located at the area where the thin film transistor is not formed and is connected to the exposed drain electrode 4b, is formed by patterning the deposited ITO electrode 8 through the photolithography process using the mixed solution of HCl and $HNO_3$ or oxalic acid as an etching solution.

Hereinafter, the process of patterning the ITO electrode 8 using the conventional etching solution and the fabrication method of the thin film transistor display device will be described in more detail as follows.

As shown in FIG. 2A, a metal is deposited on the glass substrate 1 to form the gate electrode 2a by patterning the metal through a photolithography process.

The gate insulating film 3 and the amorphous silicon 5a and the $n^+$ amorphous silicon 5b are sequentially deposited over the above structure.

As shown in FIG. 2B, a photoresist is formed on the entire surface of the above structure, and exposed and developed to form a photoresist pattern located at the upper peripheral part of the amorphous silicon 5a and the $n^+$ amorphous silicon 5b facing into the gate electrode 2a.

The amorphous silicon 5a and the $n^+$ amorphous silicon 5b are etched by an etching process using a photoresist pattern as an etching mask to form the active area 5.

The remaining photoresist pattern is removed, and a Mo layer is deposited on the entire surface. Then, the structure is patterned again using a photolithography process to form the source electrode 4a and the drain electrode 4b, which are located at the upper left and right parts and the side parts of the active area 5.

In addition, as shown in FIG. 2C, the passivation film 7 is deposited on the above structure. A photoresist layer is formed on the passivation film 7, and exposed and developed to form a pattern for exposing the passivation film 7.

In FIG. 2D, a contact hole 9 for exposing a part of the drain electrode 4b is formed by etching the exposed passivation film 7. Thereafter, ITO is deposited on the surface of the above structure to form an ITO electrode 8.

FIG. 3 is a cross-sectional view showing a cross-section along line III—III of FIG. 1. As shown therein, a pin hole 10 may be formed in the passivation film 7, and the pin hole 10 exposes a part of the data line 4.

A photoresist layer is formed on the surface of the ITO electrode 8, and then, exposed and developed to form a pattern. Thereafter, the ITO electrode 8 pattern, which is connected to the drain electrode 4b and located at the area where the thin film transistor is not formed, is formed by an etching process using the photoresist pattern as an etching mask.

In this process, when a mixed solution of HCl and $HNO_3$ is used as an etching solution, the etching solution contacts the data line 4 through the pin hole 10 formed on the passivation film 7. Therefore, the data line 4 formed of Mo is etched.

The mixed solution of HCl and $HNO_3$ generally used in the process is mixed with water at a rate of 18.5% and 4.5% in weight, respectively. When such an etching solution is used, an etching rate for Mo reaches as fast as 10 Å/sec, thereby damaging the source electrode 4a and the drain electrode 4b.

As described above, if a part of the data line 4 is etched, a disconnection occurs at the data line 4. Therefore, the mixed solution of HCl and $HNO_3$ cannot be used as an etching solution for the thin film transistor display device using Mo as a source electrode and a drain electrode.

Therefore, oxalic acid in which solid $C_2H_2O_4$ is dissolved in water is used as an etching solution. Oxalic acid does not etch the Mo source and drain electrodes, which are exposed by the pin hole unlike the mixed solution of HCl and $HNO_3$. However, the $C_2H_2O_4$ aqueous solution, which $C_2H_2O_4$ is dissolved in water, is precipitated as $C_2H_2O_4$ powder when it is dried after ITO is etched. The precipitated $C_2H_2O_4$ powder sticks to a pipe line, a nozzle, a valve, a flow meter, and a pump, etc. of the etching apparatus. Therefore, the equipment is damaged, and problems such as a wrong operation of a sensor and a conveying error in the apparatus may be occurred.

Therefore, oxalic acid cannot be used in a track type and a roller conveying type equipment due to the above problems.

As described above, the mixed solution of HCl and $HNO_3$ used for etching ITO in the conventional art etches the Mo base source and drain electrodes through the pin hole generated in the passivation film. Therefore, the liquid crystal display device is deteriorated.

SUMMARY OF THE INVENTION

Accordingly, the present invention is directed to an etchant for patterning indium tin oxide and a method of fabricating a liquid crystal display device using the same that substantially obviates one or more of problems due to limitations and disadvantages of the related art.

Another object of the present invention is to provide an etchant for patterning indium tin oxide for preventing Mo from being etched and precipitation of the etch solution.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an etchant for patterning indium tin oxide is a mixed solution of HCl, $CH_3COOH$, and water.

In another aspect of the present invention, a method of fabricating a liquid crystal display device includes forming a gate electrode on a substrate, forming a gate insulating layer and an amorphous silicon layer on the gate electrode including the substrate, forming an active area by patterning the amorphous silicon layer, forming a source electrode and a drain electrode on the active area, forming a passivation layer on the source electrode and the drain electrode and the gate insulating layer, forming a contact hole exposing a part of the drain electrode, forming an indium tin oxide layer on the passivation layer, and forming an indium tin oxide electrode by selectively etching the indium tin oxide layer using a mixed solution of HCl, $CH_3COOH$, and water as an etchant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
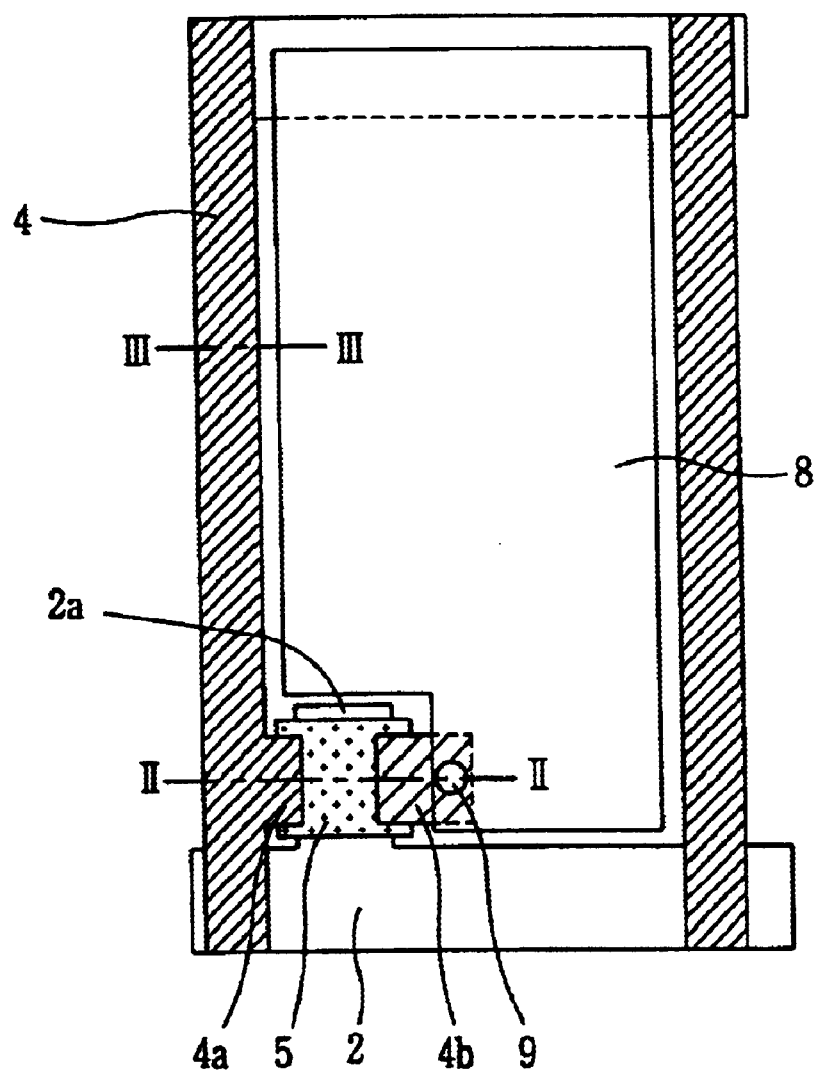
FIG. 1 is a plane view of a conventional liquid crystal display device.
Figure 2A:
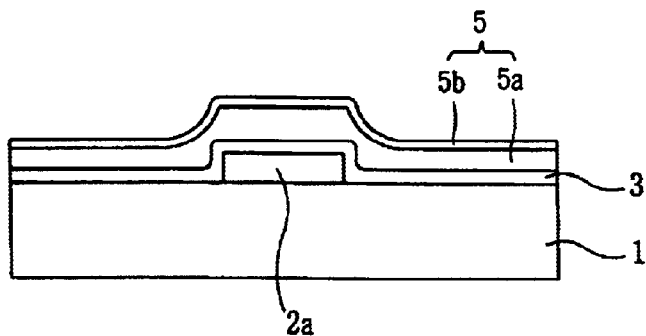
FIGS. 2A to 2D are sequential cross-sectional views, along line II—II of FIG. 1, illustrating a fabrication process by using a conventional etchant for etching indium tin oxide along line II—II of FIG. 1.
Figure 2B:
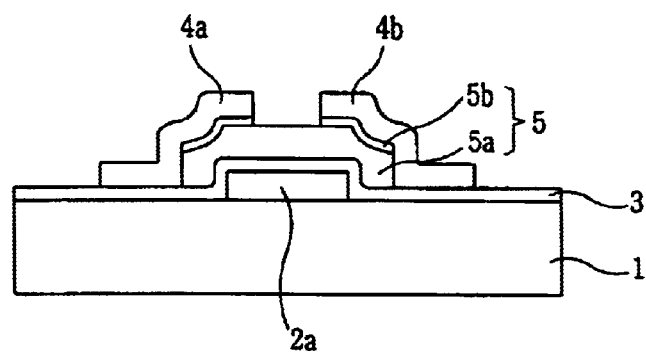
Figure 2C:
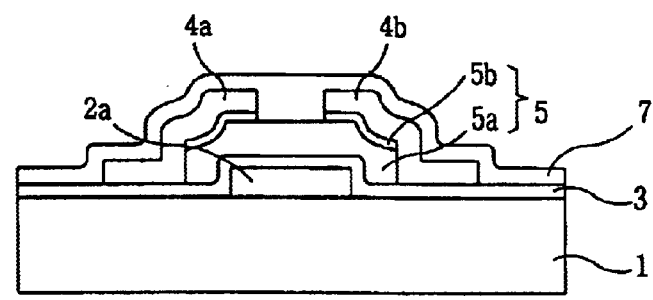
Figure 2D:
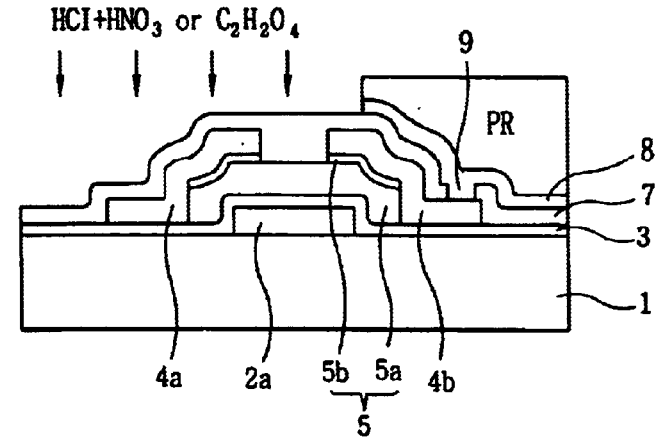
Figure 3:
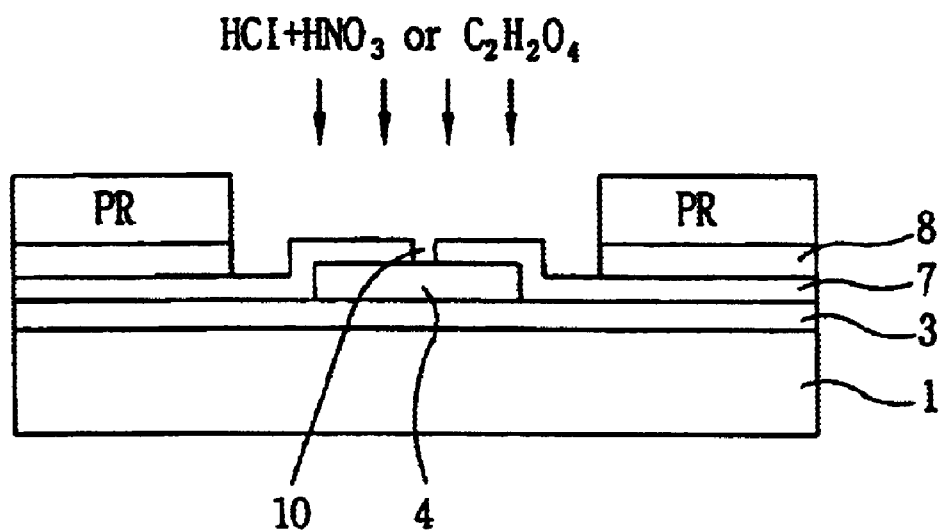
FIG. 3 is a cross-sectional view, along line III—III of FIG. 1, illustrating that the Mo base data line is etched by using the conventional etchant.

FIGS. 4A to 4D are sequential cross-sectional views, along line II—II of FIG. 1, illustrating a process of fabricating a liquid crystal display device according to the present invention.

Figure 4A:
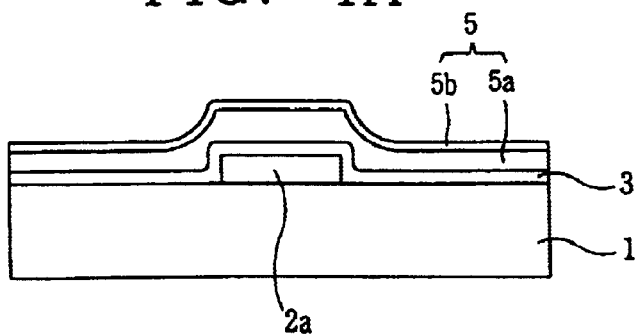
FIGS. 4A to 4D are sequential cross-sectional views, along line II—II of FIG. 1, illustrating a fabrication process by using an ITO etchant according to the present invention.

As shown in FIG. 4A, a gate electrode 2a is formed on a glass substrate 1. A gate insulating film 3, an amorphous silicon 5a, an n+ amorphous silicon 5b are sequentially formed on the gate electrode 2a including the glass substrate 1.

Figure 4B:
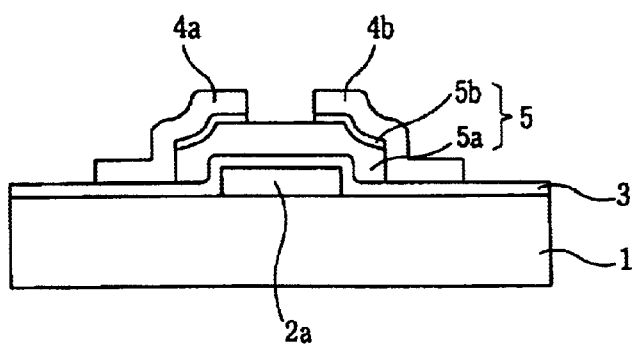

In FIG. 4B, an active area 5 is formed by patterning the amorphous silicon 5a and the n+ amorphous silicon 5b. A source electrode 4a and a drain electrode 4b, separated apart from each other, are formed on the active area 5 including the side surface of the active area 5. Mo or Mo alloy is deposited on the active area 5 including the gate insulating film 3. Thereafter, the deposited Mo or Mo alloy is patterned to form a source electrode 4a and a drain electrode 4b.

Figure 4C:
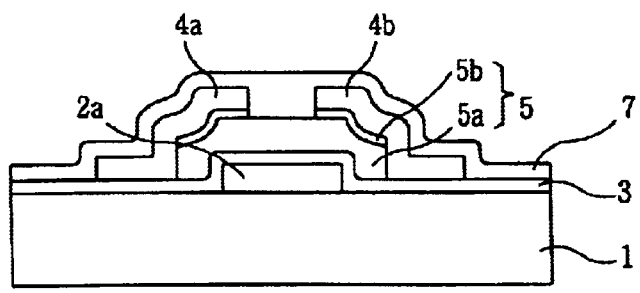

A passivation film 7 is formed on the entire surface of the above structure, as shown in FIG. 4C.

Figure 4D:
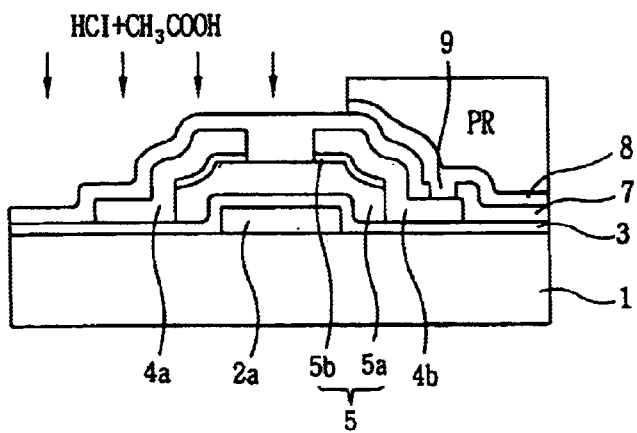

In FIG. 4D, an ITO layer is formed on the passivation film 7 after exposing the upper part of the drain electrode 4b by forming a contact hole 9 on the passivation film 7 through a photolithography process. An ITO electrode 8 is formed by etching the ITO layer by using a mixed solution of HCl and $CH_3COOH$ as an etchant. The ITO electrode 8 is connected to the exposed drain electrode 4b and located at the area where the thin film transistor is not formed.

Hereinafter, the process of patterning the amorphous indium tin oxide (a-ITO) electrode 8 using the etchant of the present invention, and the method of fabricating a liquid crystal display device using the same will be described in more detail as follows.

As shown in FIG. 4A, a metal layer is deposited on the glass substrate 1 to form the gate electrode 2a by patterning the deposited metal layer through a photolithography process. In addition, the gate insulating film 3 and the amorphous silicon 5a and the n⁺ amorphous silicon 5b are sequentially deposited on the surface of the above structure.

Then, as shown in FIG. 4B, a photoresist layer is formed to the surface of the above structure. It is then exposed and developed to form a photoresist pattern on the upper and peripheral parts of the amorphous silicon 5a facing into the gate electrode 2a.

In addition, the exposed amorphous silicon 5a and the n⁺ amorphous silicon 5b are patterned by an etching process using the photoresist pattern as an etching mask to form the active area 5.

Then, the remaining photoresist pattern is removed. And a Mo or Mo alloy layer is deposited on the entire surface, and patterned again using a photolithography process to form the source electrode 4a and the drain electrode 4b located on the upper left and right parts and the side surface of the active area 5.

As shown in FIG. 4C, the passivation film 7 is deposited on the entire surface of the above structure.

In FIG. 4D, the photoresist layer is formed on the passivation film 7 and a photoresist pattern for exposing the passivation film 7 is formed by an exposure and development process.

The exposed passivation film 7 is etched to form a contact hole 9 for exposing a part of the drain electrode 4b. An a-ITO layer is deposited on the entire surface of the above structure to form an a-ITO electrode 8.

Then, another photoresist layer is formed on the entire surface of the a-ITO electrode 8 to form a pattern by using a photolithography process. An a-ITO electrode pattern is formed by an etching process using the above photoresist pattern as an etching mask. The a-ITO electrode pattern is connected to the drain electrode 4b and located at the area where the thin film transistor is not located.

Figure 5:
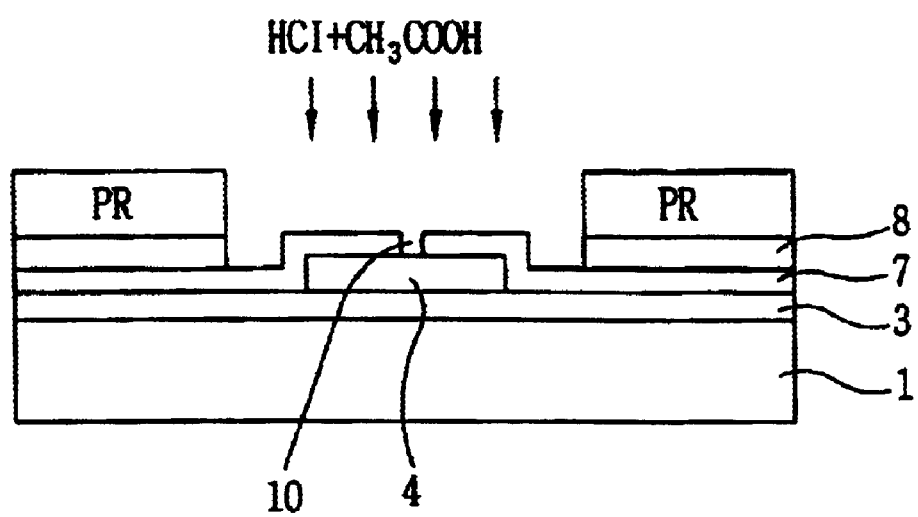
FIG. 5 is a cross-sectional view, along line III—III of FIG. 1, illustrating that the Mo base data line is not damaged by the ITO etchant according to the present invention.

FIG. 5 is a cross-sectional view, along line III—III of FIG. 1, illustrating that the Mo base data line is not damaged by the ITO etchant according to the present invention.

When a mixed solution of HCl and $CH_3COOH$ is used as an etchant and a pin hole 10 is formed in the passivation film 7, the etchant contacts the source electrode 4a, the drain electrode 4b, or the data line 4 through the pin hole 10.

As described above, when the mixed solution of HCl and $CH_3COOH$ contacts the Mo or Mo alloy base source electrode 4a or the data line 4, the source electrode 4a, the drain electrode 4b or the data line 4 may be etched due to HCl in the solution. However, the etching of the Mo or Mo alloy base source electrode 4a, the drain electrode 4b, or the data line 4 may be prevented by using each amount of HCl and $CH_3COOH$ to be 1 to 10% in weight of the mixed solution. For example, when HCl is 10% and $CH_3COOH$ is 10% of the mixed solution, the amount of water is 80% in weight.

That is, when each of HCl and $CH_3COOH$ is mixed in water with the rates of 1 to 10% in weight and the mixed solution is used as an etchant, Mo is not etched even if the above etchant contacts the Mo or Mo alloy base source electrode 4a, the drain electrode 4b, and the data line 4 through the pin hole 10.

The rates of 3 to 7% in weight of each HCl and $CH_3COOH$ with water may also be used as an etchant. According to the above mixing rates, the Mo or Mo alloy layer is not etched. As an example, the mixing rate of 5% of each HCl and $CH_3COOH$ with 90% water in weight may be used in the present invention.

In the present invention, if a concentration of HCl in the mixed solution of HCl, $CH_3COOH$, and water is larger than 18% in weight, the Mo or Mo alloy layer is etched. In addition, the Mo or Mo alloy layer is not etched at all in a low concentration.

When the mixed solution of HCl, $CH_3COOH$, and water is used as an etchant to pattern an ITO layer, a problem of the conventional art of using oxalic acid is solved. In the conventional art, a breakdown of the equipment may occur due to the precipitation of $C_2H_2O_4$. In the present invention, both a dipping method and a spray method may be used to etch the ITO layer.

That is, the $C_2H_2O_4$ precipitation occurs after drying the etchant because powdered $C_2H_2O_4$ is dissolved in the water. This may be prevented by diluting HCl and $CH_3COOH$ in water at a desired rate.

As described above, the mixed solution of HCl, $CH_3COOH$, and water having a low concentration is used as an etchant for patterning the a-ITO. Therefore, the Mo or the Mo alloy layer of the source electrode, the drain electrode, and the data line is not damaged even if the pin hole is formed in the passivation film, that is, the underlying layer. In addition, the liquid states of HCl and $CH_3COOH$ do not cause a problem of the precipitation after the etching and drying processes. Thus, the Mo or Mo alloy layer is not damaged by the HCl and $CH_3COOH$ etching solution. Also, productivity is increased since an error on the equipment caused by the precipitation is prevented, and reliability of the processes is increased.

It will be apparent to those skilled in the art that various modifications and variations can be made in the etchant for patterning indium tin oxide and the method of fabricating liquid crystal display device using the same of the present invention without departing from the spirit or scope of the inventions. Thus, it is intended that the present invention covers the modifications and variations of this invention provided they come within the scope of the appended claims and their equivalents.

What is claimed is:

1. A method of fabricating a liquid crystal display device comprising:

forming a gate electrode on a substrate;

forming a gate insulating layer and an amorphous silicon layer on the gate electrode including the substrate;

forming an active area by patterning the amorphous silicon layer;

forming a source electrode and a drain electrode on the active area;

forming a passivation layer on the source electrode and the drain electrode and the gate insulating layer;

forming a contact hole exposing a part of the drain electrode;

forming an indium tin oxide layer on the passivation layer; and forming an indium tin oxide electrode by selectively etching the indium tin oxide layer using a mixed solution of HCl, $CH_3COOH$, and water as an etchant, wherein the HCl and the $CH_3COOH$ is about 1% to about 10% respectively by weight for the total weight.

2. The method of claim 1, wherein the etching the indium tin oxide layer is performed by a dipping process.

3. The method of claim 1, wherein the etching the indium tin oxide layer is performed by a spray process.

4. The method of claim 1, wherein the indium tin oxide layer is amorphous.

5. The method of claim 1, wherein the source electrode and the drain electrode are formed of one of molybdenum and molybdenum alloy.

6. A method of fabricating a liquid crystal display device comprising:

forming a gate electrode on a substrate;

forming a gate insulating layer and an amorphous silicon layer on the gate electrode including the substrate;

forming an active area by patterning the amorphous silicon layer;

forming a molybdenum source electrode and a molybdenum drain electrode on the active area;

forming a passivation layer on the molybdenum source electrode and the molybdenum drain electrode and the gate insulating layer;

forming a contact hole exposing a part of the drain electrode;

forming an indium tin oxide layer on the passivation layer; and forming an indium tin oxide electrode by selectively etching the indium tin oxide layer using a mixed solution of HCl, $CH_3COOH$ and water as an etchant by using a spray process, wherein the HCl and the $CH_3COOH$ is about 1% to 10% respectively by weight for the total weight.

7. The method of claim 1, wherein the HCl is about 5% by weight for the total weight.

8. The method of claim 1, wherein the $CH_3COOH$ is about 5% by weight for the total weight.

* * * * *